United States Patent
Yang et al.

(10) Patent No.: US 7,760,557 B2
(45) Date of Patent: Jul. 20, 2010

(54) BUFFER CONTROL CIRCUIT OF MEMORY DEVICE

(75) Inventors: Sun-Suk Yang, Kyoungki-do (KR); Ki-Chang Kwean, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 230 days.

(21) Appl. No.: 12/005,573

(22) Filed: Dec. 27, 2007

(65) Prior Publication Data

US 2009/0067260 A1    Mar. 12, 2009

(30) Foreign Application Priority Data

Sep. 12, 2007    (KR) .................. 10-2007-0092555

(51) Int. Cl.
    *G11C 7/10*    (2006.01)
(52) U.S. Cl. ..................... 365/189.05; 365/189.08
(58) Field of Classification Search ............ 365/189.05, 365/189.08, 233.11, 233.19
    See application file for complete search history.

(56) References Cited

U.S. PATENT DOCUMENTS

| | | | | |
|---|---|---|---|---|
| 5,905,392 A | * | 5/1999 | Chun | .................. 327/198 |
| 6,292,420 B1 | * | 9/2001 | Kim et al. | .............. 365/185.05 |
| 6,906,976 B2 | * | 6/2005 | Kwean | ................ 365/222 |

FOREIGN PATENT DOCUMENTS

| | | |
|---|---|---|
| KR | 2001-0004670 | 1/2001 |
| KR | 2004-0057344 | 7/2004 |
| KR | 1020070038774 | 4/2007 |

* cited by examiner

*Primary Examiner*—Richard Elms
*Assistant Examiner*—Hien N Nguyen
(74) *Attorney, Agent, or Firm*—Blakely, Sokoloff, Taylor & Zafman

(57) ABSTRACT

Buffer control circuit of memory device having a buffer control circuit of a memory device comprises an auto-refresh buffer controller configured to detect a data training operation in an auto-refresh mode and a controller configured to enable an input buffer in response to an enable signal generated in the data training operation by the auto-refresh buffer controller.

17 Claims, 4 Drawing Sheets

BUFFER CONTROL CIRCUIT OF MEMORY DEVICE

CROSS-REFERENCE TO RELATED APPLICATIONS

The present invention claims priority of Korean patent application number 10-2007-0092555, filed on Sep. 12, 2007, which is incorporated by reference in its entirety.

BACKGROUND OF THE INVENTION

The present invention relates to a buffer control circuit of a memory device, and more particularly, to a buffer control circuit of a memory device, which can minimize an operating current consumption of a dynamic random access memory (DRAM) by efficiently controlling a buffer in an auto-refresh mode.

Generally, a system includes an operation processor and a memory device. To achieve a high-speed of operation or signal processing, the operation processor has to process a large number of data bits at a time. Further, a large quantity of data to be processed must be supplied to the operation processor in accordance with its operation process. Therefore, an operation speed of the system is determined by whether data required can be supplied to the memory device at an appropriate time or not.

When a large quantity of data is outputted from the memory device by a switching operation in order to increase the operation speed of the system, a large amount of current is supplied from a power line to a switching element. At this point, the current consumed generates switching noise due to parasitic components of the power line, resulting in delay and distortion of output data. When output data of a large number of bits are switched in one direction and output data of a small number of bits are switched in another direction, e.g., an opposite direction, a delay time of the output data becomes different according to the switching direction of the output data. This causes a skew between the output data.

The skew increases as the number of bits of the output data is larger, parasitic components are larger, and the operating speed is higher The skew means a timing mismatch between data. In a read operation or a write operation, a data training is performed for controlling the skew between data. The data training represents a technique to control the skew between data by using data pattern known to a controller and a memory device. The data training may be classified into a write training and a read training.

A unit cell of a dynamic random access memory (DRAM) consists of one transistor and one capacitor, and data is stored in the capacitor. However, since the capacitor formed on a semiconductor substrate is not completely electrically isolated from peripheral elements, the stored data are not retained, that is, electric charges are discharged. In other words, leakage current is generated and thus data of the memory cell may be damaged. Therefore, the memory device periodically performs a refresh operation to maintain electric charges stored in the capacitor.

The memory device with a refresh mode performs a refresh operation while sequentially changing internal addresses in response to an external command. More specifically, when the memory device enters a refresh mode in response to an external command, a row address sequentially increases in every constant period and a word line is selected. Electric charges stored in the capacitor corresponding to the word line are amplified by a sense amplifier and are again stored in the capacitor. The stored data can be retained without damage through the refresh process.

The conventional memory device controls the disabling of data input/output buffers by performing no data training operation in the auto-refresh mode. Since it is unnecessary to control the enabling of the data buffers, a current for controlling the data buffers is not consumed.

Meanwhile, the data input/output buffers are required to be enabled even in the auto-refresh mode because a memory device needs to perform a data training operation in an initialization mode and an auto-refresh mode. That is, if the data training operation is performed, all data input/output buffers are ready to receive data. Therefore, all data input/output buffers must be in an enabled state during the auto-refresh mode. Further, the data clock controller, the command decoder, and the command clock controller must maintain an enabled state in order for the data training operation.

However, the current consumption increases when the data input/output buffers and other elements are enabled during the auto-refresh mode. If the memory device enters the auto-refresh mode, the data input/output buffers and other elements are enabled even in the low power mode, thus increasing the current consumption.

SUMMARY OF THE INVENTION

Embodiments of the present invention are directed to providing a buffer control circuit of a memory device, which can minimize operating current consumption by selectively controlling the enabling of data input/output buffers using a data training control signal.

Embodiments of the present invention are also directed to providing a buffer control circuit of a memory device, which can minimize operating current consumption by selectively controlling the enabling of data input/output buffers in an auto-refresh mode and a low power mode.

The buffer control circuit enables the data input/output buffers only when a data training operation is performed in an auto-refresh mode, and disables the data input/output buffers in a low power mode or even in the auto-refresh mode when a data training operation is not performed.

In accordance with an aspect of the present invention, there is provided a buffer control circuit of a memory device includes an auto-refresh buffer controller configured to detect a data training operation in an auto-refresh mode and a controller configured to enable an input buffer in response to an enable signal generated in the data training operation by the auto-refresh buffer controller.

DESCRIPTION OF SPECIFIC EMBODIMENTS

Hereinafter, a buffer control circuit of a memory device in accordance with the present invention will be described in detail with reference to the accompanying drawings.

Figure 1:
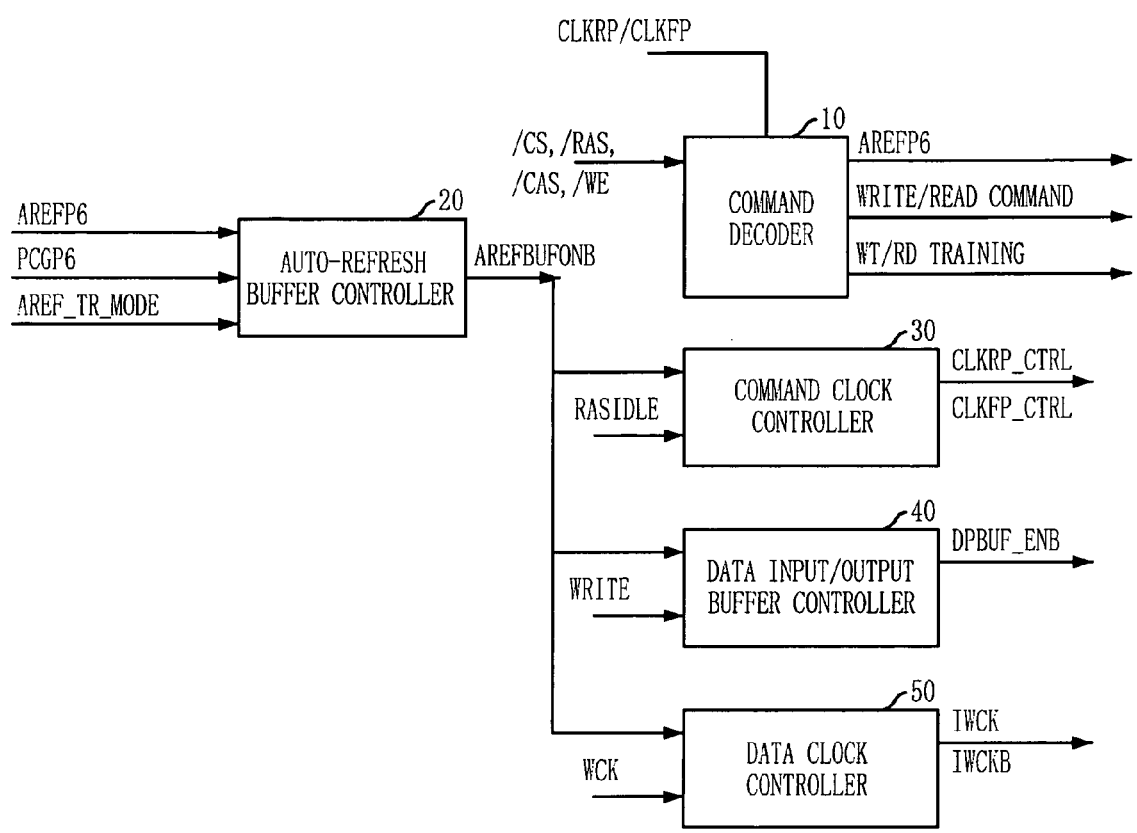
FIG. 1 is a block diagram illustrating a buffer control circuit of a memory device in accordance with an embodiment of the present invention.

FIG. 1 is a block diagram illustrating a buffer control circuit of a memory device in accordance with an embodiment of the present invention.

Referring to FIG. 1, the buffer control circuit includes a command decoder 10, an auto-refresh buffer controller 20, a command clock controller 30, a data input/output buffer controller 40, and a data clock controller 50.

The command decoder 10 is configured to receive external commands /CS, /RAS, /CAS and /WE and a clock signal CLKRP/CLKFP to generate an auto-refresh control signal AREFP6, a write/read command, and a data training signal WT/RD_TRAINING.

The auto-refresh buffer controller 20 is configured to receive the auto-refresh control signal AREFP6 and a data training control signal AREF_TR_MODE to generate an enable control signal AREFBUFONB for controlling the enabling of a data input/output buffer in the auto-refresh mode. The data training control signal AREF_TR_MODE is generated from a mode register set (MRS) (not shown) and indicates whether to perform a data training operation in the auto-refresh mode.

The command clock controller 30, the data input/output buffer controller 40, and the data clock controller 50 are enabled in response to the enable control signal AREFBUFONB outputted from the auto-refresh buffer controller 20. The command clock controller 30 generates a clock signal necessary for generating control and address signals, and the data clock controller 50 generates a clock signal necessary for inputting/outputting data Even in the auto-refresh mode, the buffer control circuit enables the data input/output buffer only when the data training operation is performed.

Figure 2:
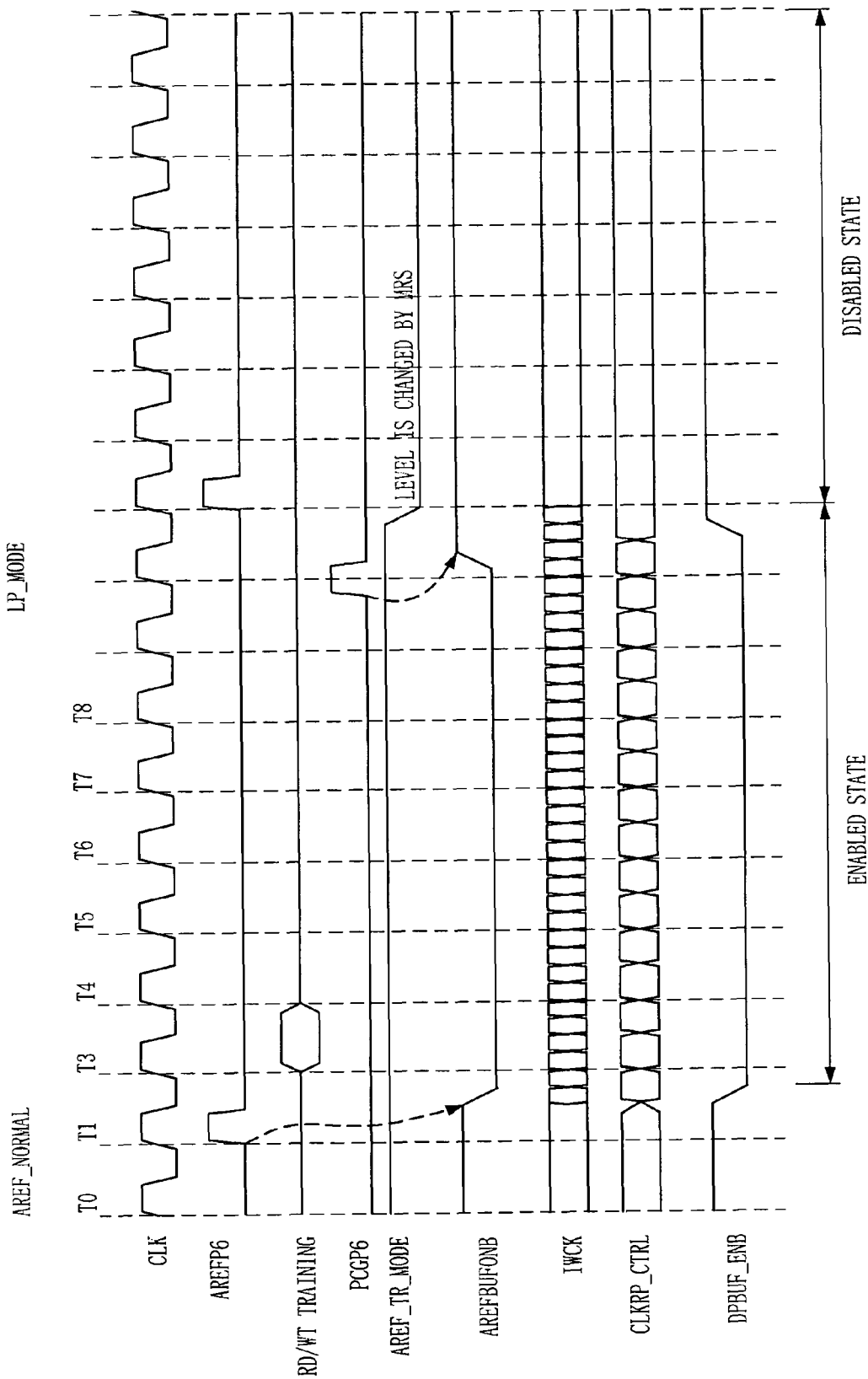
FIG. 2 is a timing diagram of signals for enabling a data input/output buffer in an auto-refresh mode and a low power mode.

FIG. 2 is a timing diagram illustrating the enabling of the data input/output buffer in the auto-refresh mode and a low power mode.

The auto-refresh buffer controller 20 confirms the auto-refresh mode using the auto-refresh control signal AREFP6 generated from the command decoder 10. The auto-refresh buffer controller 20 confirms whether to perform the data training operation using the data training control signal $AREF_{13}TR\_MODE$. That is, when the auto-refresh control signal AREFP6 is inputted, the beginning of the auto-refresh mode is confirmed, but whether to enable the data input/output buffer in a current state is not yet confirmed.

The auto-refresh buffer controller 20 confirms whether to perform the data training operation using the data training control signal $AREF_{13}TR\_MODE$. When the data training control signal $AREF_{13}TR\_MODE$ is in a logic high state, the auto-refresh buffer controller 20 confirms that the data training is performed. Therefore, when the auto-refresh control signal AREFP6 is inputted and the data training control signal $AREF_{13}TR\_MODE$ is in a logic high state in the auto-refresh mode, the auto-refresh buffer controller 20 confirms that the read training or write training is performed in the auto-refresh mode. Therefore, when the above-described conditions are satisfied, the auto-refresh buffer controller 20 outputs the enable control signal AREFBUFONB of a logic low level to enable the data input/output buffer.

The enable control signal AREFBUFONB outputted from the auto-refresh buffer controller 20 is inputted to the command clock controller 30, the data input/output buffer controller 40, and the data clock controller 50.

Generally, the data input/output buffer controller 40 is enabled when a write control signal WRITE is inputted. However, the data input/output buffer controller 40 in accordance with the embodiment of the present invention generates an enable signal DQBUF_ENB for enabling the data input/output buffer only when it receives the enable control signal AREFBUFONB of an enabled state, i.e., a logic low level from the auto-refresh buffer controller 20 in such a state that the write control signal WRITE is inputted. Therefore, when the auto-refresh buffer controller 20 outputs the enable control signal AREFBUFONB of a logic low state, the data input/output buffer controller 40 generates the enable signal DQBUF_ENB. When the data input/output buffer controller 40 outputs the enable signal DQBUF_ENB of an enabled state, a data input/output buffer (not shown) is ready to receive data.

When the auto-refresh butter controller 20 provides the enable control signal AREFBUFONB of a logic low level in such a state that a control signal RASIDLE is in a logic low state, the command clock controller 30 is enabled to generate the clock signal CLKRP_CTRL necessary for control and address signals. The control signal RASIDLE has a logic low level when a bank is enabled, while it has a logic high level in a precharge mode.

Generally, the data clock controller 50 is enabled when a write clock signal WLCK is inputted. However, the data clock controller 50 in accordance with the embodiment of the present invention generates a clock signal IWCK, which is used in data input and output, only when the auto-refresh buffer controller 20 provides the enable control signal AREFBUFONB of the enabled state, i.e., a logic low state.

The enable control signal AREFBUFONB outputted from the auto-refresh buffer controller 20 is disabled in response to a precharge control signal PCGP6. The precharge control signal PCGP6 represents the termination of the data training operation. The precharge operation is to precharge bit lines connecting a memory cell to a bit line sense amplifier. The precharge operation is performed before enabling the bit line sense amplifier. Therefore, when the precharge control signal PCGP6 is inputted, the enable control signal AREFBUFONB outputted from the auto-refresh buffer controller 20 turns to a logic high level.

The command clock controller 30, the data input/output buffer controller 40, and the data clock controller 50 are all disabled in response to the enable control signal AREFBUFONB having a logic high level. That is, the data training operation is terminated during the auto-refresh operation and the data input/output buffer is disabled. The generation of the command clock signal and the data clock signal is stopped.

In a state that the enable control signal AREFBUFONB outputted from the auto-refresh buffer controller 20 is disabled, the auto-refresh control signal AREFP6 is deactivated and the data input/output buffer, the command clock controller 30, and the data clock controller 50 are disabled in a low power mode LP_MODE.

That is, the mode register set controls the data training operation not to be performed in the low power mode LP_MODE. In other words, the mode register set generates the data training control signal AREF_TR_MODE of a logic low level in the low power mode LP_MODE. In such a control state, the auto-refresh buffer controller 20 maintains the enable control signal AREFBUFONB at a logic high level even though the auto-refresh control signal AREFP6 is inputted.

As described above, when the auto-refresh buffer controller 20 maintains the enable control signal AREFBUFONB at a logic high level, the data input/output buffer controller 40, the command clock controller 30, and the data clock controller 50 maintain the disabled state as illustrated in FIG. 2. Even though the auto-refresh operation is performed, the data input/output buffer controller 40, the command clock controller 30, and the data clock controller 50 maintain the disabled state in the low power mode LP_MODE. Therefore, the current consumption in the auto-refresh operation can be reduced.

The circuit configurations and operations of the controllers in the buffer control circuit of the memory device will be described below.

Figure 3:
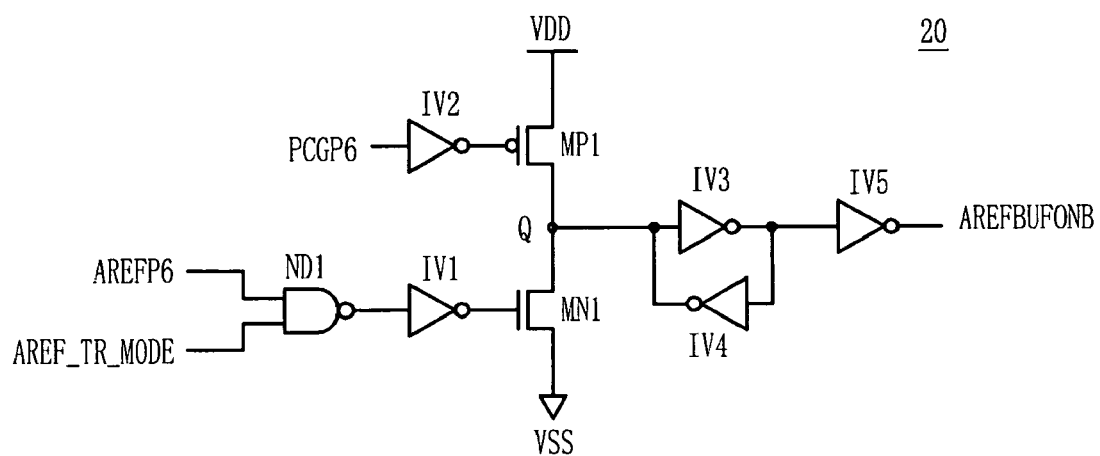
FIG. 3 is a circuit diagram of an auto-refresh buffer controller illustrated in FIG. 1.

FIG. 3 is a circuit diagram of the auto-refresh buffer controller illustrated in FIG. 1.

The auto-refresh buffer controller 20 receives the auto-refresh control signal AREFP6, the data training control signal $AREF_{13}$ TR_MODE, and the precharge control signal PCGP6 during the data training operation and the precharge operation, respectively.

The auto-refresh control signal AREFP6 and the data training control signal AREF_TR_MODE are inputted to a NAND gate ND1. An output signal of the NAND gate ND1 is inputted to a gate of an NMOS transistor MN1 through an inverter IV1. The precharge control signal PCGP6 is inverted by an inverter IV2 and inputted to a gate of a PMOS transistor MP1. The PMOS transistor MP1 and the NMOS transistor MN1 are serially connected between a power supply voltage VDD and a ground terminal VSS. Two inverters IV3 and IV5 are serially connected to a common node Q of the PMOS transistor MP1 and the NMOS transistor MN1. An inverter IV4 is connected in parallel to the inverter IV3 to thereby configure a latch.

In the auto-refresh buffer controller 20, when the auto-refresh control signal AREFP6 and the data training control signal $AREF_{13}$ TR_MODE have a logic high level, which indicates the auto-refresh operation and the data training operation are performed, the NAND gate ND1 outputs a logic low level signal. This signal is inverted to a logic high level signal by the inverter IV1 and inputted to the gate of the NMOS transistor MN1, so that the NMOS transistor MN1 is turned on.

Since the NMOS transistor MN1 is turned on, the signal at the common node Q becomes a logic low level, regardless of the logic level of the precharge control signal PCGP6. This signal is outputted as a logic low level signal through the repetitive inverting operations of the two inverters IV3 and IV5.

Thereafter, the auto-refresh control signal AREFP6 turns to a logic low level signal, so that the NMOS transistor MN1 is turned off. The enable control signal AREFBUFONB is maintained at a logic low level by the inverters IV3 and IV4. The logic low level signal is the enable control signal AREFBUFONB that enables the data input/output buffer when the data training operation is performed during the auto-refresh mode.

Therefore, when the data training control signal $AREF_{13}$ TR_MODE is at a logic high level, the auto-refresh signal AREFP6 of a logic high level is applied so that the auto-refresh butter controller 20 outputs the enable control signal AREFBUFONB of the enabled state, i.e., the logic low level.

In such a state, when the precharge control signal PCGP6 of a logic high level is inputted, the PMOS transistor MP1 is turned on in response to the logic low level signal inputted by the inverter IV2, while the NMOS transistor MN1 is turned off. The signal at the common node Q becomes a logic high level and is inverted to a logic high level by two inverting operations. The NMOS transistor MN1 is maintained in the turned-off state, and the enable control signal AREFBU-FONB is maintained at a logic high level by the two inverters IV3 and IV4. The logic high level signal is the enable control signal AREFBUFONB that disables the data input/output buffer. That is, the enable control signal AREFBUFONB outputted from the auto-refresh buffer controller 20 changes from the enabled state to the disabled state in response to the precharge control signal PCGP6.

When the data training control signal $AREF_{13}$ TR_MODE is at a logic low level, the auto-refresh buffer controller 20 must maintain the disabled state even though the auto-refresh control signal AREFP6 of a logic high level is applied. That is, the NAND gate ND1 outputs a logic high level signal when the auto-refresh control signal AREFP6 is a logic high level signal and the data training control signal $AREF_{13}$ TR_MODE is a logic low level signal. This signal is inverted and turns off the NMOS transistor MN1. That is, the signal at the common node Q can not be changed.

Since the output signal of the auto-refresh buffer controller 20 has been at a logic high level in response to the precharge control signal PCGP6, a logic high level signal continuously disables the data input/output buffer.

Figure 4:
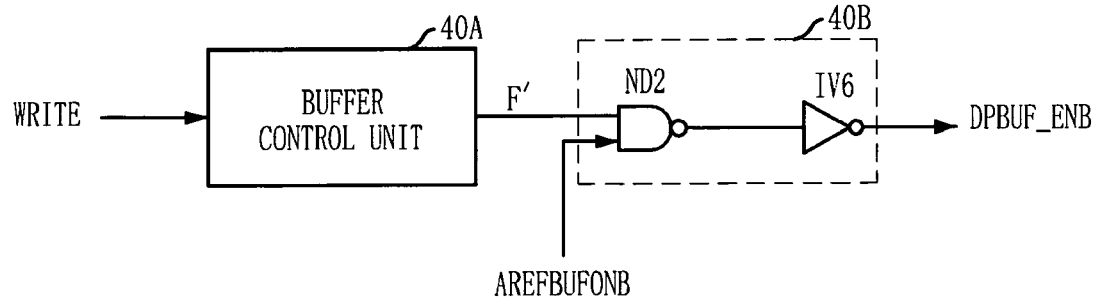
FIG. 4 is a circuit diagram of a data input/output buffer controller illustrated in FIG. 1.

FIG. 4 is a circuit diagram of the data input/output buffer controller 40 illustrated in FIG. 1.

Referring to FIG. 4, the data input/output buffer controller 40 includes a buffer control unit 40A and an operation unit 40B. The buffer control unit 40A outputs an enable signal F' in response to the write control signal WRITE, and the operation unit 40B performs an AND operation on the enable signal F' and the enable control signal AREFBUFONB outputted from the auto-refresh buffer controller 20. The operation unit 40B includes a NAND gate ND2 configured to perform a NAND operation on the enable signal F' and the enable control signal AREFBUFONB, and an inverter IV6 configured to invert an output signal of the NAND gate ND2.

Therefore, the data input/output buffer controller 40 enables the data input/output buffer when the enable control signal AREFBUFONB outputted only during the data training operation is inputted with a logic low level in the auto-refresh mode.

Figure 5:
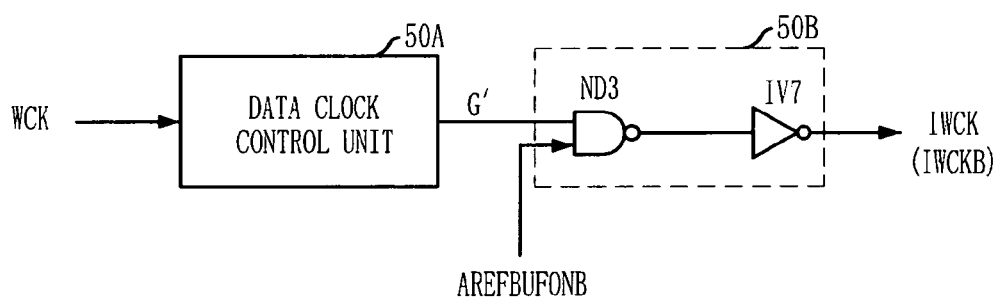
FIG. 5 is a circuit diagram of a data clock controller illustrated in FIG. 1.

FIG. 5 is a circuit diagram of the data clock controller illustrated in FIG. 1. The data clock controller 50 includes a data clock control unit 50A and an operation unit 50B. The data clock control unit 50A outputs an enable signal G' in response to a data write signal WLCK, and the operation unit 50B performs an AND operation on the enable signal G' and the enable control signal AREFBUFONB. The operation unit 50B includes a NAND gate ND3 configured to perform a NAND operation on the enable signal G' and the enable control signal AREFBUFONB, and an inverter IV7 configured to invert an output signal of the NAND gate ND3.

Therefore, the data clock controller 50 generates the clock signal IWCK when the enable control signal AREFBUFONB outputted only when the data training operation is inputted with a logic low level in the auto-refresh mode.

The data clock controller 50 is enabled in the read or write operation to perform a toggling operation. The data clock controller 50 continuously performs the toggling operation only when the data training operation is performed in the auto-refresh mode, but it is disabled in the low power mode LP_MODE or precharge mode, thereby preventing the current consumption caused by the continuous toggling operation.

Figure 6:
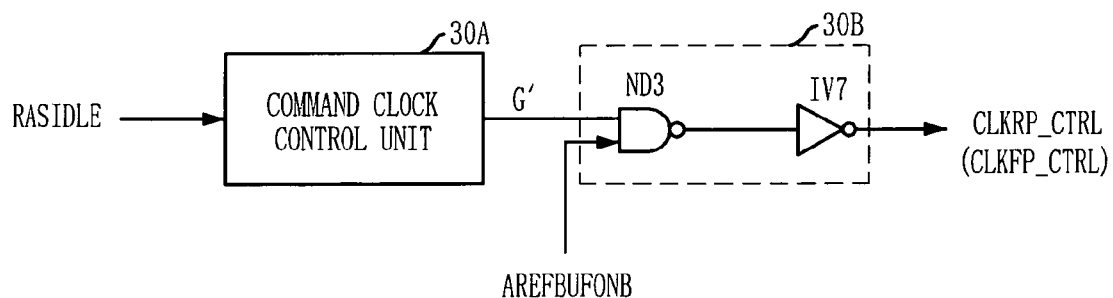
FIG. 6 is a circuit diagram of a command clock controller illustrated in FIG. 1.

FIG. 6 is a circuit diagram of the command clock controller illustrated in FIG. 1. The command clock controller 30 includes a command clock control unit 30A and an operation unit 30B. The command clock control unit 30A outputs an enable signal E' in response to a control signal RASIDLE having a logic low level when the memory device is activated. The operation unit 30B performs an AND operation on the control signal E' and the enable control signal AREFBUFONB. The operation unit 30B includes a NAND gate ND4 configured to perform a NAND operation on the control signal E' and the enable control signal AREFBUFONB, and an inverter IV8 configured to invert an output signal of the NAND gate ND4.

Therefore, the command clock controller 30 generates the clock signal CLKRP_CTRL or CLKFP_CTRL when the enable control signal AREFBUFONB outputted only when the data training operation is inputted with a logic low level in the auto-refresh mode.

The command clock controller 30 generates a clock signal for controlling the command signal. The command clock controller 30 continuously performs a toggling operation of the clock signal only when the data training operation is performed in the auto-refresh mode, but it is disabled in the low power mode LP_MODE or precharge mode, thereby preventing the current consumption caused by the continuous toggling operation.

As described above, the buffer control circuit in accordance with the embodiments of the present invention is applied to the controlling of the enabling operation of the data input/output buffer only when the data training operation is performed in the auto-refresh mode.

Accordingly, the buffer control circuit of the memory device in accordance with the embodiments of the present invention enables the data input/output buffers only when a data training operation is performed in an auto-refresh mode, and disables the data input/output buffers in a low power mode or even in the auto-refresh mode when a data training operation is not performed. In this way, the operating current consumption of the memory device can be minimized by effectively controlling the operations of the data input/output buffer, the command clock controller, and the data clock controller.

While the present invention has been described with respect to the specific embodiments, it will be apparent to those skilled in the art that various changes and modifications may be made without departing from the spirit and scope of the invention as defined in the following claims.

What is claimed is:

1. A buffer control circuit of a memory device, comprising:
    an auto-refresh buffer controller configured to detect a data training operation in an auto-refresh mode; and
    a controller configured to enable an input buffer in response to an enable signal generated in the data training operation by the auto-refresh buffer controller.

2. The buffer control circuit as recited in claim 1, wherein the controller comprises a clock controller configured to generate a clock signal for data read or write operation.

3. The buffer control circuit as recited in claim 2, wherein the clock controller comprises an operation unit configured to perform an AND operation on a first output signal, which is generated in response to a write clock signal, and an output signal of the auto-refresh buffer controller.

4. The buffer control circuit as recited in claim 1, wherein the controller comprises a command clock controller configured to generate a clock signal for command control.

5. The buffer control circuit as recited in claim 4, wherein the command clock controller comprises an operation unit configured to perform an AND operation on a first output signal, which is generated in response to a control signal having a logic low level when a bank is enabled, and an output signal of the auto-refresh buffer controller.

6. The buffer control circuit as recited in claim 1, wherein the controller comprises a data input/output buffer controller configured to enable a data input/output buffer.

7. The buffer control circuit as recited in claim 6, wherein the data input/output buffer controller comprises an operation unit configured to perform an AND operation on a first output signal, which is generated in response to a write control signal, and an output signal of the auto-refresh buffer controller.

8. The buffer control circuit as recited in claim 1, further comprising a mode register set (MRS) configured to generate a data training control signal to the auto-refresh buffer controller.

9. The buffer control circuit as recited in claim 8, further comprising a command decoder configured to generate an auto-refresh control signal to the auto-refresh buffer controller.

10. The buffer control circuit as recited in claim 9, wherein the auto-refresh buffer controller is configured to enable an output signal when the auto-refresh control signal is received when a data training control signal is activated, and disable the output signal when a precharge control signal is received.

11. The buffer control circuit as recited in claim 10, wherein the auto-refresh buffer controller comprises:
    a NAND gate configured to perform a NAND operation on the data training control signal and the auto-refresh control signal;
    an NMOS transistor configured to be turned on/off in response to an inversion signal of an output signal of the NAND gate;
    a PMOS transistor serially connected to the NMOS transistor between a power supply voltage terminal and a ground terminal and turned on/off in response to an inverted precharge control signal; and
    a latch configured to store a logic value of a common node between the NMOS transistor and the PMOS transistor.

12. A buffer control circuit of a memory device, comprising:
    a command decoder configured to generate an auto refresh control signal in response to command signals;
    an auto-refresh buffer controller configured to generate an enable control signal in response to the auto-refresh control signal and a training control signal;
    a controller configured to generate an enable signal in response to the enable control signal; and
    an input buffer for buffering an input signal in response to the enable signal.

13. The buffer control circuit as recited in claim 12, wherein the controller comprises a clock controller configured to generate a clock signal for data read or write operation.

14. The buffer control circuit as recited in claim 12, wherein the controller comprises a command clock controller configured to generate a clock signal for command control.

15. The buffer control circuit as recited in claim 12, wherein the controller comprises a data input/output buffer controller configured to enable a data input/output buffer.

16. The buffer control circuit as recited in claim 12, further comprising a mode register set (MRS) configured to generate a data training control signal to the auto-refresh buffer controller.

17. The buffer control circuit as recited in claim 12, further comprising a command decoder configured to generate an auto-refresh control signal to the auto-refresh buffer controller.

* * * * *